Feb. 7, 1967 R. KRAUSZ 3,303,436
SUBMINIATURE CRYSTAL OSCILLATOR OF HIGH STABILITY
Filed March 12, 1964
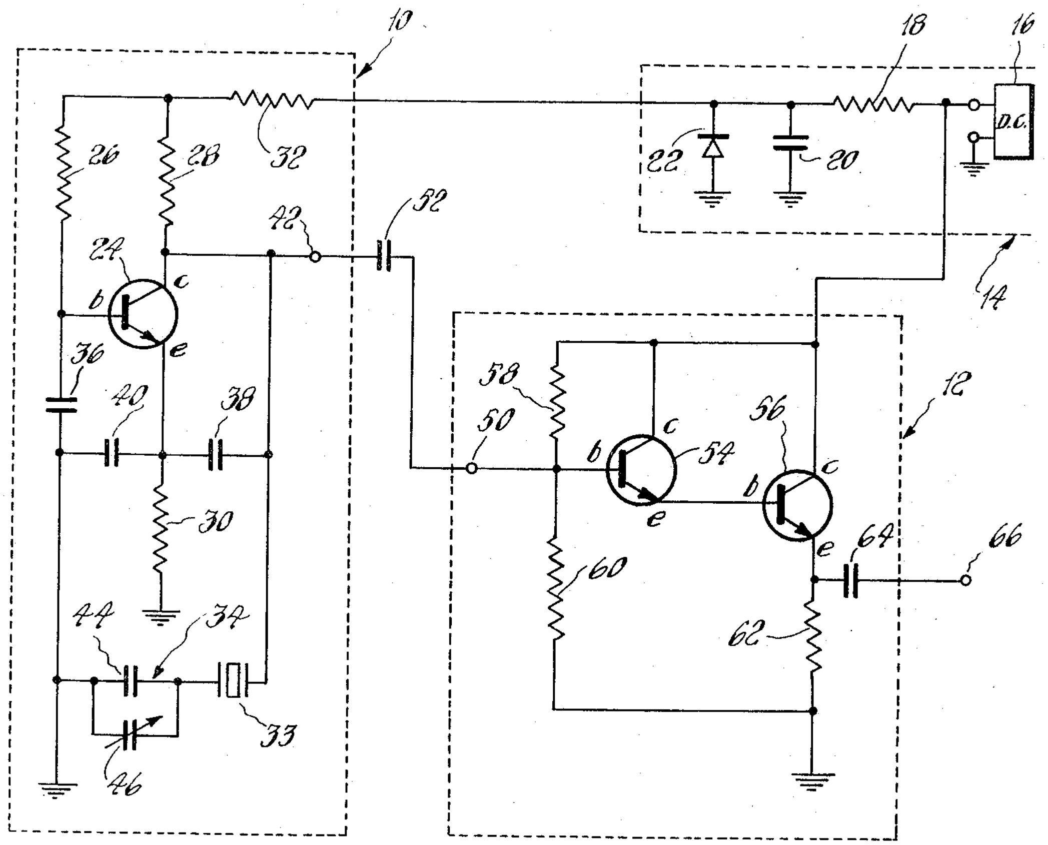
INVENTOR.
ROBERT KRAUSZ
BY Arthur L. Bowers
AGENT
Max H. Farmer
ATTORNEY 3,303,436

SUBMINIATURE CRYSTAL OSCILLATOR OF HIGH STABILITY

Robert Krausz, Stamford, Conn., assignor, by mesne assignments, to the United States of America as represented by the Secretary of the Navy Filed Mar. 12, 1964, Ser. No. 351,573
1 Claim. (Cl. 331—116)

This invention relates to a superior crystal oscillator transistor circuit.

An object of this invention is to provide a subminiature oscillator circuit characterized by exceptional stability, low power dissipation, that is capable of uninterrupted operation over relatively long time periods, and that is simple to fabricate, compact, and reliable, and that is suitable for operation as a frequency standard.

Other objects and advantages will appear from the following description of an example of the invention, and the novel features will be particularly pointed out in the appended claims.

The single figure includes a schematic circuit diagram of an embodiment of the invention.

The illustrated circuit includes an oscillator stage 10, a buffer stage 12, and a regulated power supply 14. The power supply includes a direct current source 16 and a filter including resistor 18 and capacitor 20 across the source and Zener diode 22 across the capacitor. The oscillator includes a transistor 24 in grounded base connection. A base biasing resistor 26, a collector load resistor 28 and an emitter resistor 30 are connected to the corresponding terminals *b*, *c*, and *e* of the transistor. An oscillator stabilizing resistor is connected between the positive terminal of the regulated power supply and the other ends of resistors 26 and 28. The other end of the emitter resistor is connected to a reference or ground to which is connected the negative terminal of power supply 14. A crystal 33 and a tuning capacitor means 34 are connected in series between the collector electrode and the ground. A bypass capacitor 36 is connected between the base and ground. A swamping capacitor 38 is connected between the collector and emitter and a second swamping capacitor 40 is connected between the emitter and ground. The output of the oscillator is taken between the terminal 42 connected to the collector and ground.

The tuning capacitor means 34 includes a selected fixed capacitor 44 and a fine adjustment capacitor 46 connected across the capacitor 44. The capacitors 44 and 46 are selected to establish the desired output frequency. The capacitor 46 is adjustable to compensate for crystal aging.

The swamping capacitors have sufficiently large capacitance relative to the emitter-collector capacitance and the emitter base capacitance whereby change of internal capacitance in the transistor has essentially no effect on the operation of the oscillator. The swamping capacitors function as a voltage divider feedback circuit.

The stabilizing resistor 43 is small being on the order of less than five percent of the collector load resistor and the latter is on the order of less than five percent of the base biasing resistor. The stabilizing resistor functions to compensate for change in transistor gain by causing an opposing change in the base current.

The output terminal 42 is coupled to the input terminal 50 of a buffer amplifier stage 12 through a coupling capacitor 52. The buffer amplifier stage operates to increase the power level of the energy output of the oscillator and to isolate the highly stable oscillator from loading effects. It is a double emitter follower with very high input and low output impedance.

The buffer stage 12 includes a transistor 54 direct coupled to a transistor 56. The collectors of both transistors are connected to the positive terminal of the direct current supply 16. A base biasing voltage divider resistor network 58 and 60 is connected between the positive terminal of the direct current supply 16 and ground to provide base bias for transistor 54. An emitter output resistor 62 is connected between the emitter of transistor 56 and ground. A coupling capacitor 64 is connected between the emitter of transistor 56 and output terminal 66.

The circuit elements, other than the crystal 33 do not age significantly and therefore permit extremely stable operation and ultra stable frequency output. The very small physical size of the components makes the circuit arrangement suitable for subminiature packaging. The relatively low power dissipation makes the circuit arrangement suitable for location in a constant temperature environment in a subminiature oven that uses relatively little heating power and to portable battery operation. The invention is capable of long periods of uninterrupted operation and is insensitive to crystal parameters. The only tuned element in the circuit is the crystal and the frequency may be adjusted with capacitor 46. This invention is of relatively simple and compact and very reliable in operation. It is suitable for use as an ultra stable subminiature frequency standard when combined with temperature control means.

In an embodiment of this invention that was successfully operated at one megacycle per second, the components were as follows:

| | | |
|---|---|---|
| Resistors: | | |
| **18** | | 2.7K |
| **26** | | 200K |
| **28** | | 5.6K |
| **30** | | 1K |
| **32** | ohms | 100 |
| **58** | meg | 5.1 |
| **60** | meg | 5.1 |
| **62** | | 10K |
| Capacitors: | | |
| **20** | μf | .1 |
| **36** | μf | .01 |
| **38** | pf | 1000 |
| **40** | pf | 1000 |
| **44** | pf | 110 |
| **46** | pf | .8 to 18 |
| **52** | pf | 10 |
| **64** | μf | .01 |
| Transistors: | | |
| **24** | | 904A |
| **54** | | 904 |
| **56** | | 904 |
| Crystal | | A-T cut |

Diode:
22—13 volt Zener diode.

Direct current supply:
16–24 Volt battery

It will be understood that various changes in the details, materials and arrangements of parts (and steps), which have been herein described and illustrated in order to explain the nature of the invention, may be made by those skilled in the art within the principle and scope of the invention as expressed in the appended claim.

I claim:

A subminiature oscillator of high stability comprising:
a transistor having emitter, collector, and base,
a crystal connected at one end of the collector,
an alternating current bypass capacitor connected at one end to the base, tuning capacitor means for the crystal connected in series with the other end of the crystal and the other end of the bypass capacitor, an emitter resistor connected between the emitter and the junction between the bypass capacitor and the tuning capacitor means, a swamping capacitor connected between emitter and collector, another swamping capacitor connected between emitter and the junction between the bypass capacitor and the tuning capacitor means, a base bias resistor and a collector load resistor connected in common at one end and connected to base and collector respectively at their other ends, and a stabilizing resistor connected at one end to the commonly connected ends of base biasing resistor and collector load resistor, the resistance of the stabilizing resistor being on the order of less than five percent of the resistance of the collector load resistor and the resistance of the collector load resistor being less than five percent of the resistance of the base biasing resistor, and a direct current power supply having its positive terminal connected to the other end of the stabilizing resistor and having its negative terminal connected to the junction between said bypass capacitor and tuning compacitor means.

References Cited by the Examiner

UNITED STATES PATENTS

| | | | |
|---|---|---|---|
| 2,995,712 | 8/1961 | Montgomery ______ | 330—32 X |
| 3,068,415 | 12/1962 | Johnson. | |
| 3,079,566 | 2/1963 | Ebbinge __________ | 330—22 X |
| 3,110,863 | 11/1963 | Weidknecht et al. __ | 331—116 X |

OTHER REFERENCES

Basic Theory and Application of Transistors, TM–11–690, Department of the Army technical manual, March 1959, page 177.

Electronics, March 29, 1963, page 34.

Hurley, "Designing Transistor Circuits Sinusoidal Transistor Oscillators—Part 2," Electronic Equipment, October 1957, pp. 20–27.

Newell et al., "Measuring Eyeball Pressure with a Crystal Oscillator," Electronics, September 8, 1961, pp. 64–65.

Military Standardization Handbook Selected Semiconductor Circuits, Mil–HDBK–215, June 15, 1960, pages 5–24, 5–25.

Keonjian, "Stable Transistor Oscillator," Electrical Engineering, August 1955, pages 672–674.

ROY LAKE, *Primary Examiner.*

J. B. MULLINS, *Assistant Examiner.*